United States Patent
Bae et al.

(10) Patent No.: US 10,056,229 B2
(45) Date of Patent: Aug. 21, 2018

(54) CHARGED-PARTICLE BEAM EXPOSURE METHOD AND CHARGED-PARTICLE BEAM CORRECTION METHOD

(71) Applicant: SAMSUNG ELECTRONICS CO., LTD., Suwon-si, Gyeonggi-Do (KR)

(72) Inventors: Sukjong Bae, Seoul (KR); Myoungsoo Lee, Yongin-si (KR); Inkyun Shin, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 69 days.

(21) Appl. No.: 15/442,754

(22) Filed: Feb. 27, 2017

(65) Prior Publication Data

US 2018/0012730 A1 Jan. 11, 2018

(30) Foreign Application Priority Data

Jul. 7, 2016 (KR) ........................ 10-2016-0086238

(51) Int. Cl.
*H01J 37/20* (2006.01)
*H01J 37/317* (2006.01)
*B29C 67/00* (2017.01)
*G03F 7/20* (2006.01)
*G03F 7/00* (2006.01)

(52) U.S. Cl.
CPC ...... *H01J 37/3174* (2013.01); *B29C 67/0051* (2013.01); *G03F 7/0035* (2013.01); *G03F 7/70991* (2013.01); *G03F 2007/2067* (2013.01); *H01J 2237/004* (2013.01); *H01J 2237/0245* (2013.01); *H01J 2237/31755* (2013.01); *H01J 2237/31788* (2013.01)

(58) Field of Classification Search
CPC ............ H01J 37/3174; H01J 2237/004; H01J 2237/0245; H01J 2237/31755; H01J 2237/31788; B29C 67/0051; G03F 7/0035; G03F 7/70991; G03F 2007/2067
USPC ......... 250/396 R, 397, 492.1, 492.2, 492.21, 250/492.22, 492.23, 492.3
See application file for complete search history.

(56) References Cited

U.S. PATENT DOCUMENTS

| 4,818,885 A * | 4/1989 | Davis ..................... B82Y 10/00 250/398 |
| 6,753,253 B1 * | 6/2004 | Takahashi ............ H01J 37/304 257/E21.295 |

(Continued)

FOREIGN PATENT DOCUMENTS

| JP | H05-343306 A | 12/1993 |
| JP | 2010-073909 A | 4/2010 |

(Continued)

*Primary Examiner* — Nicole Ippolito
(74) *Attorney, Agent, or Firm* — Volentine, Whitt & Francos, PLLC

(57) ABSTRACT

A charged-particle beam exposure method includes providing a sample that has patterns having shot densities different from each other, using the sample to obtain pattern drift values correlated with the shot densities, and irradiating the sample with a charged-particle beam to perform an exposure process on the sample. The irradiating of the sample with the charged-particle beam is carried out while a deflection voltage, which is applied to the charged-particle beam to deflect the charged-particle beam, is corrected based on the pattern drift value corresponding to a shot density of a pattern to be formed on the sample.

20 Claims, 10 Drawing Sheets

(56) References Cited

U.S. PATENT DOCUMENTS

| | | | |
|---|---|---|---|
| 6,965,116 B1* | 11/2005 | Wagner | H01J 37/3171 |
| | | | 250/397 |
| 7,305,333 B2 | 12/2007 | Stanton | |
| 7,705,322 B2 | 4/2010 | Nishimura et al. | |
| 7,880,151 B2 | 2/2011 | Wells | |
| 8,362,450 B2 | 1/2013 | Iizuka et al. | |
| 8,835,881 B2 | 9/2014 | Kamikubo | |
| 9,236,154 B2 | 1/2016 | Nakada et al. | |
| 2005/0151947 A1* | 7/2005 | Fujimaki | G03F 7/70716 |
| | | | 355/55 |
| 2006/0169895 A1* | 8/2006 | Honda | H01J 37/153 |
| | | | 250/310 |
| 2008/0302961 A1* | 12/2008 | Tashiro | H01J 37/20 |
| | | | 250/310 |
| 2015/0355547 A1* | 12/2015 | Bae | G03F 1/56 |
| | | | 355/67 |

FOREIGN PATENT DOCUMENTS

| | | |
|---|---|---|
| JP | 2012-109483 A | 6/2012 |
| JP | 2014-123613 A | 7/2014 |

\* cited by examiner

CHARGED-PARTICLE BEAM EXPOSURE METHOD AND CHARGED-PARTICLE BEAM CORRECTION METHOD

PRIORITY STATEMENT

This U.S. non-provisional patent application claims priority under 35 U.S.C § 119 of Korean Patent Application 10-2016-0086238 filed on Jul. 7, 2016, the entire contents of which are hereby incorporated by reference.

BACKGROUND

The present inventive concept relates to the fabricating of photomasks and the like having fine patterns requiring high dimensional accuracy. In particular, the present inventive concept relates to an exposure system and to an exposure method of exposing a substrate to a charged-particle beam.

The manufacturing of electronic products typically includes a photolithography process. Photolithography is a lithography technique for forming a pattern, e.g., a circuit pattern, of a semiconductor device or the like. Photolithography includes an exposure process of transferring an image of a mask pattern of a photomask to a photoresist layer on a substrate. The exposed photoresist layer is then developed in a process that selectively removes (exposed or non-exposed) portions of the photoresist layer, thereby forming a photoresist pattern. An underlying layer(s) is then etched using the photoresist pattern as a mask. As a result, a pattern corresponding to the mask pattern is transcribed onto the substrate.

Accordingly, the accuracy of the mask pattern, such as accuracy of the positions of features of the mask pattern relative to one another, is a very critical factor in determining the product quality. The photomask is generally fabricated by an electron beam exposure system. In a conventional electron beam exposure system, a substrate is scanned by an electron beam to form the mask pattern.

SUMMARY

According to the present inventive concept, there is provided a charged-particle beam method may comprising: moving a stage on which a target sample is disposed, an exposure process of irradiating the target sample with the charged-particle beam while the stage is moving, and controlling the charged-particle beam to impart a direction drift thereto depending on a direction in which the stage is moving, and in which the controlling comprises a correction process including correcting for an error in the direction drift, which if otherwise left uncorrected would result in the direction drift deviating from an intended direction drift, in accordance with the direction in which the stage is moving.

According to the present inventive concept, there is also provided a charged-particle beam method comprising: providing a sample that includes patterns having shot densities different from each other, using the sample to obtain pattern drift values correlated to the shot densities, respectively, and an exposure process of irradiating a target sample with a charged-particle beam to transfer a pattern to the target sample in shots, at a shot density, across a region of the target sample, and in which the irradiating of the target sample with the charged-particle beam comprises a correction process of regulating a deflection voltage, which is applied to the charged-particle beam to deflect the charged-particle beam, based on the pattern drift value correlated to the shot density of the pattern to be transferred to the target sample by the exposure process.

According to the present inventive concept, there is also provided a method of fabricating a patterned article of manufacture, comprising: supporting a substrate comprising a layer of resist on a stage, an exposure process including emitting a charged-particle beam from a source along a path between the source and the stage so as to irradiate the resist with the charged-particle beam, and moving the substrate using the stage within the path of the beam to scan the charged-particle beam across the substrate, a deflection process of deflecting the charged-particle beam at a location along the path during the exposure dependent on a direction in which the substrate is being moved by the stage to impart a drift to the charged-electron beam, and a correction process of determining at least one compensation drift value that controls the deflection process, and in which the at least one compensation drift value compensates for any errors in the drift associated with at least one of a direction drift phenomena and a pattern drift phenomena, which errors if otherwise left uncorrected would result in the drift deviating from a drift of the charged-particle beam necessary to cause a desired pattern to be transferred to the resist by the exposure process.

DETAILED DESCRIPTION

Figure 1:
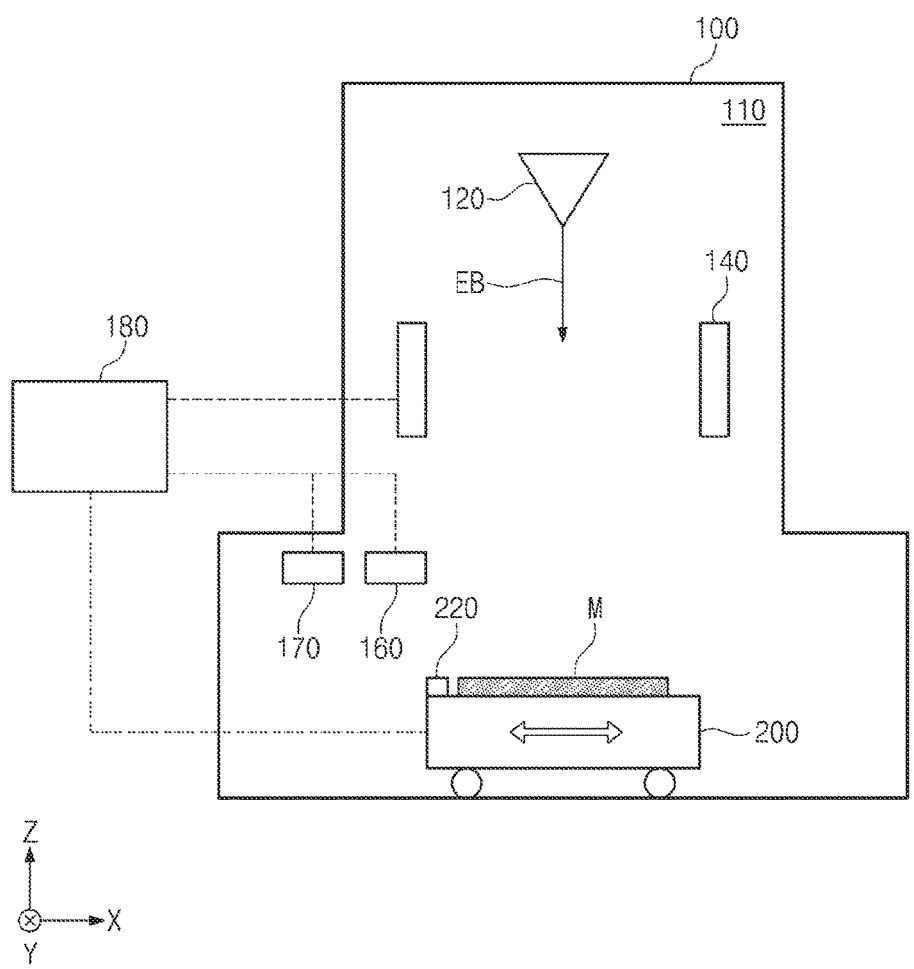
FIG. 1 is a schematic diagram of an exposure system according to the present inventive concept.

FIG. 1 shows an example of an exposure system 1 according to the present inventive concept. Referring to FIG. 1, an exposure system 1 may include a chamber 100, a beam source 120, a deflector 140, a detecting unit 160, a light-receiving unit 170, a controller 180, and a stage 200. The exposure system 1 may irradiate a sample M with a charged-particle beam EB to perform an exposure process on the sample M. An example in which the sample M is a mask and the charged-particle beam EB is an electron beam will be described hereinafter. In particular, the sample M may be a substrate comprising a layer of resist sensitive to the charged-electron beam. However, the present inventive concept is not limited to the kind of sample or the kind of charged-particle beam.

The chamber 100 may delimit an inner space 110 in which an exposure process is performed. As not shown in figures, a vacuum pump may be connected to the chamber 100 for keeping the inner space 110 in a vacuum state. As shown in FIG. 1, the beam source 120, the deflector 140, the detecting unit 160, the light-receiving unit 170, and the stage 200 may be provided in the inner space 110. Although FIG. 1 shows that the exposure system 1 has a single chamber 100, but alternatively the system 1 may have a plurality of chambers accommodating the beam source 120, the deflector 140, the detecting unit 160, the light-receiving unit 170, and the stage 200. Therefore, only one or some of the beam source 120, the deflector 140, the detecting unit 160, the light-receiving unit 170, and the stage 200 may be provided in the inner space 110, while one or others of the beam source 120, the deflector 140, the detecting unit 160, the light-receiving unit 170, may be provided outside the chamber 100 (and in another chamber communicating with chamber 100).

The beam source 120 may irradiate the mask M on the stage 200 with the electron beam EB. A voltage may be applied to the deflector 140, so that it may be possible to generate an electric field that affects the electron beam EB. When the electron beam EB passes by the deflector 140, the electric field generated from the deflector 140 may deflect the electron beam EB in a certain direction and to a certain degree. Therefore, the electric field generated from the deflector 140 may control the location at which the electron beam EB irradiates the mask M. The deflector 140 may include a metal body. The deflector 140 may surround or be disposed on opposite sides of a space through which the electron beam EB passes, i.e., may surround or be disposed on opposite sides of a path along which the electron beam EB emitted by the beam source 120 propagates from the source towards the mask M on the stage 200.

FIG. 1 includes a cross-sectional view of the deflector 140 in an X-Z plane. A deflection principle of the electric beam EB will be discussed in detail below with reference to FIG. 2. For simplicity, FIG. 1 shows that only the deflector 140 is disposed between the beam source 120 and the stage 200, but alternatively the exposure system 1 may further include an aperture for the electric beam EB, an iris diaphragm for adjusting an amount of the electric beam EB that is allowed to irradiate the mask M, or the like. The deflector 140 may have a plurality of bodies disposed along the axis along which the electric beam EB propagates in the system 1.

Figure 2:
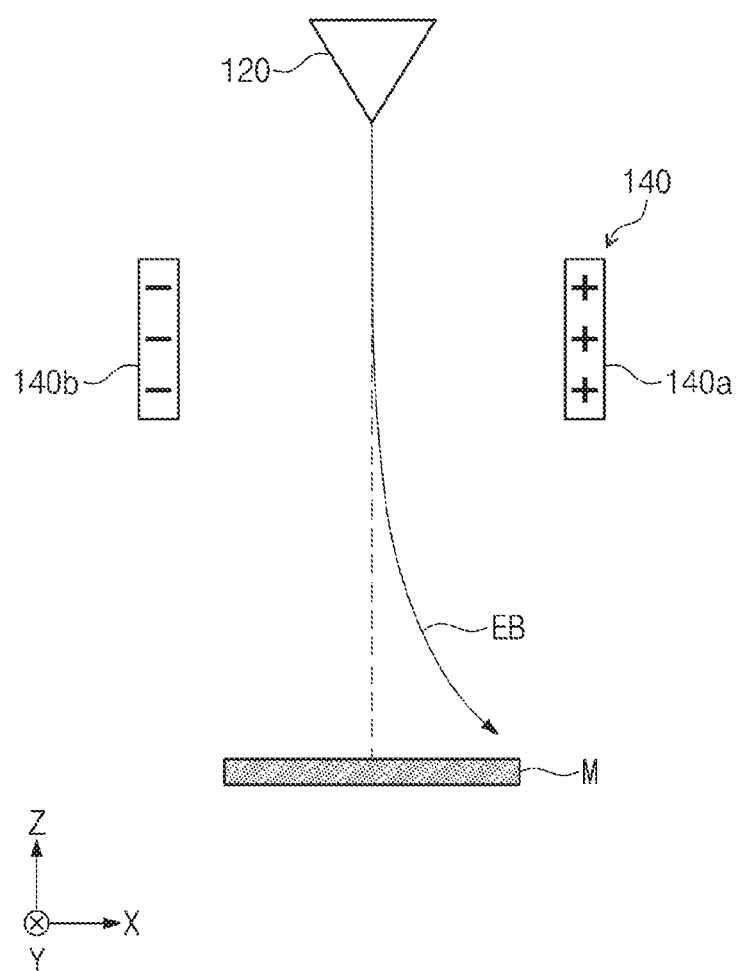
FIG. 2 is a conceptual diagram of a deflection principle of an electron beam.

FIG. 2 shows a deflection principle of the electron beam EB. For clarity of the description, FIG. 2 shows the parts of the system 1 as exaggerated in terms of their actual and relative sizes. Referring to FIGS. 1 and 2, first and second deflecting plates 140a and 140b of the deflector 140 may face each other in an X direction. The beam source 120 may emit the electron beam EB in a direction perpendicular to an upper surface of the mask M, and an electric field generated from the first and second deflecting plates 140a and 140b may deflect the electron beam EB. For example, when a positive voltage is applied to the first deflecting plate 140a and a negative voltage is applied to the second deflecting plate 140b, the electron beam EB may be deflected toward the first deflecting plate 140a. The direction and degree of deflection of electron beam EB may be adjusted depending on the direction and/or magnitude of voltage applied to the first and second deflecting plates 140a and 140b. In this description that follows, the term deflection voltage will refer to a voltage applied to the deflector 140 for deflecting the electron beam EB.

Referring back to FIG. 1, the detecting unit 160 may be disposed in the inner space 110. The detecting unit 160 may be disposed to the side of the stage 200 as located between the stage 200 and the deflector 140. The detecting unit 160 may measure a drift of the electron beam EB by receiving the electron beam EB transmitted or reflected from a mark key (see 222 of FIG. 3A) of a mark unit 220 disposed on the stage 200. For example, the detecting unit 160 may be but is not limited to a solid state detector (SSD). The measurement of the drift of the electron beam EB will be further discussed in detail below with reference to FIG. 3B. The light-receiving unit 170 may be disposed in the inner space 110. The light-receiving unit 170 may be disposed to a side of the stage 200 as located between the stage 200 and the deflector 140. The light-receiving unit 170 may receive the electron beam EB transmitted or reflected from the mask M placed on the stage 200. The controller 180 may receive obtained information about the electron beam EB from each of the detecting unit 160 and the light-receiving unit 170.

The controller 180 may control each of the deflector 140, the detecting unit 160, the light-receiving unit 170, and the stage 200. The controller 180 may include a deflection voltage controller for controlling the deflection voltage applied to the deflector 140 and a display for showing values of the drift (i.e., the measured amount of the drift) of the electron beam EB. For example, the detecting unit 160 may provide the controller 180 with information about the electron beam EB reflected from the mark key (see 222 of FIG. 3A) and the light-receiving unit 170 may provide the controller 180 with information about the electron beam EB reflected from the mask M, and the controller 180 may control the deflection voltage applied to the deflector 140 based on such information. The information about the electron beam EB may correspond to the amount of drift of the electron beam EB. For example, the information about the electron beam EB may include a direction drift created due to movement of the stage 200 and a pattern drift corresponding to a shot density. The direction and pattern drifts will be further discussed in detail below. The controller 180 may further control moving direction and moving time of the stage 200. For example, the controller 180 may drive the stage 200 to move in directions in an X-Y plane, and also along a Z axis if necessary. As not shown in figures, the controller 180 may control irradiation time and the position at which the beam source 120 emits the electron beam EB.

Figure 3A:
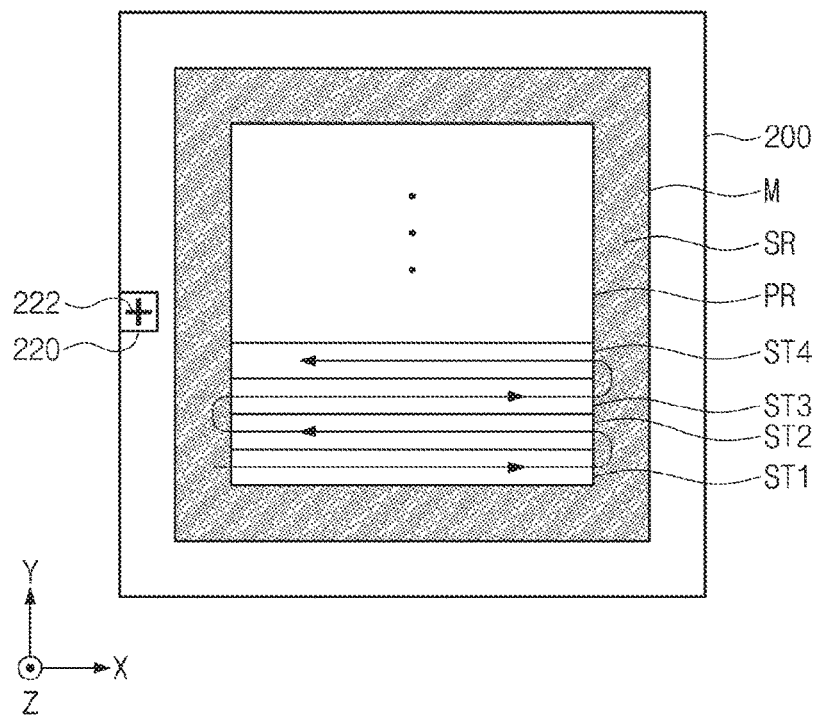
FIG. 3A is a top view of a stage of the system of FIG. 1.

FIG. 3A is a top view of the stage 200 shown in FIG. 1 and shows a direction in which the mask M is scanned by moving the stage 200 in each of X and Y directions in this example. Referring to FIG. 3A, the mask M may include a pattern region PR and a scribe region SR surrounding the pattern region PR. The pattern region PR may be a region where layout patterns are formed by an exposure process, and the scribe region SR may be a region where the layout patterns are not or are hardly formed. The pattern region PR may include a plurality of stripes ST1, ST2, ST3 and ST4. Each of the stripes ST1, ST2, ST3 and ST4 may be a discrete but imaginary or virtual region over which the electron beam EB can be deflected. In FIG. 3A, first to fourth stripes ST1 to ST4 are illustrated and an arrow is also shown to indicate an exposure sequence along a moving direction of the stage 200 when an exposure process is carried out. For example, the first to fourth stripes ST1 to ST4 may experience an exposure process in the foregoing sequence, and the first and third stripes ST1 and ST3 may experience the exposure process along a positive X direction while the second and fourth stripes ST2 and ST4 may experience the exposure process along a negative X direction. When the exposure process on each of the stripes ST1 to ST4 is terminated, the stage 200 may move the scribe region SR into the path of the electron beam EB along a Y axis toward a next exposure target (e.g., a next stripe).

Referring to FIGS. 1 and 3A, the mark unit 220 may be provided on with the stage 200. The mark unit 220 may be disposed outside the mask M. The controller 180 may control the stage 200 to move along a direction parallel to the mask M (i.e., more specifically, parallel to an upper surface of a substrate of the mask). The controller 180 may also control the stage 200 to reciprocally move along a first direction and a second direction opposite to the first direction. In this description, the first and second directions may be defined based on a moving direction of the stage 200, and the moving direction of the stage 200 may be opposite to an exposure direction of the mask M. For example, the first direction may be the negative X direction and the second direction may be the positive X direction.

Figure 3B:
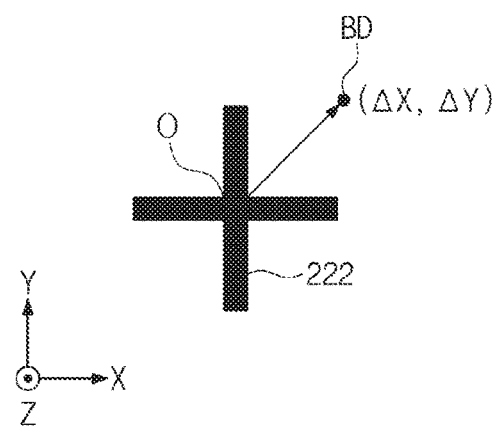
FIG. 3B is an enlarged view of a mark key of the stage shown in FIG. 3A.

FIG. 3B is an enlarged view of a mark key 222 shown in FIG. 3A. Referring to FIGS. 3A and 3B together with FIG. 1, the mark unit 220 may include a mark key 222. The mark key 222 may have a cross shape. When measuring a drift of the electron beam EB, the controller 180 may drive the stage 200 to move to an irradiation position where the electron beam EB vertically irradiates a center O of the mark key 222. The detecting unit 160 may receive the electron beam EB reflected from the mark key 222 so as to ascertain a drift value BD. For example, the drift value BD may be a position value indicating how much the electron beam EB is deflected relative to the center O of the mark key 222.

Figure 4A:
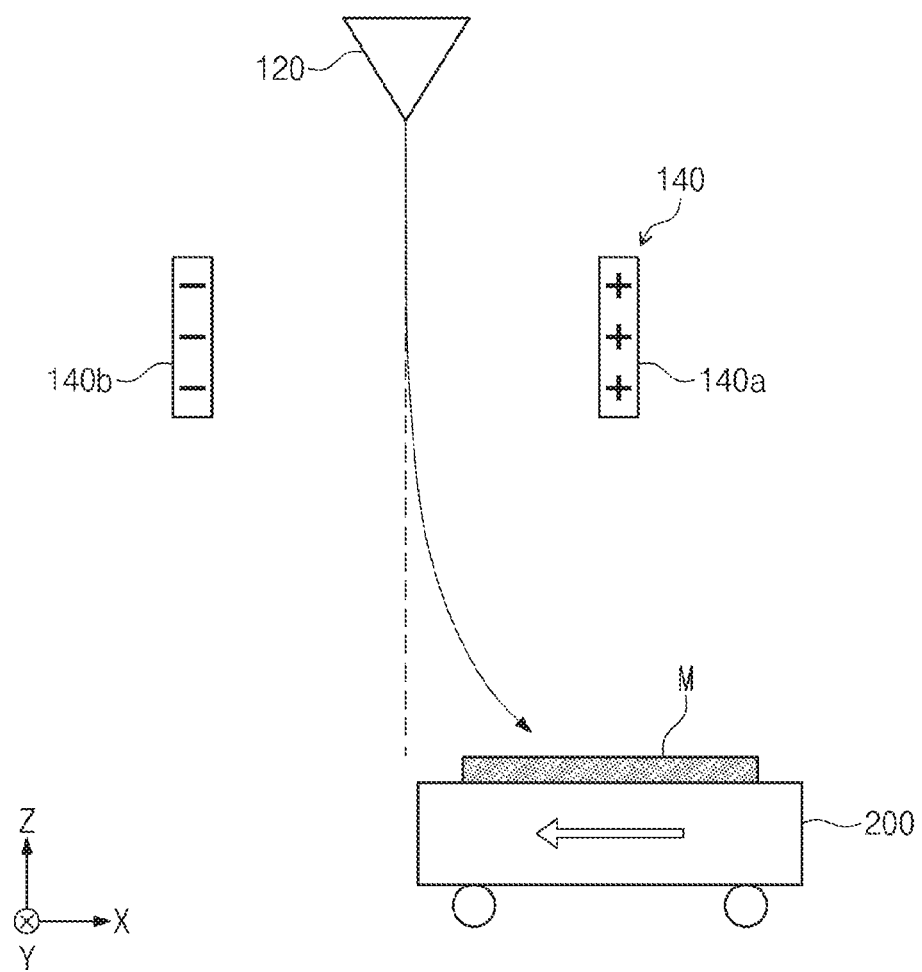
FIG. 4A is a conceptual diagram of a direction drift of an electron beam while a stage is moving along a first direction.
Figure 4B:
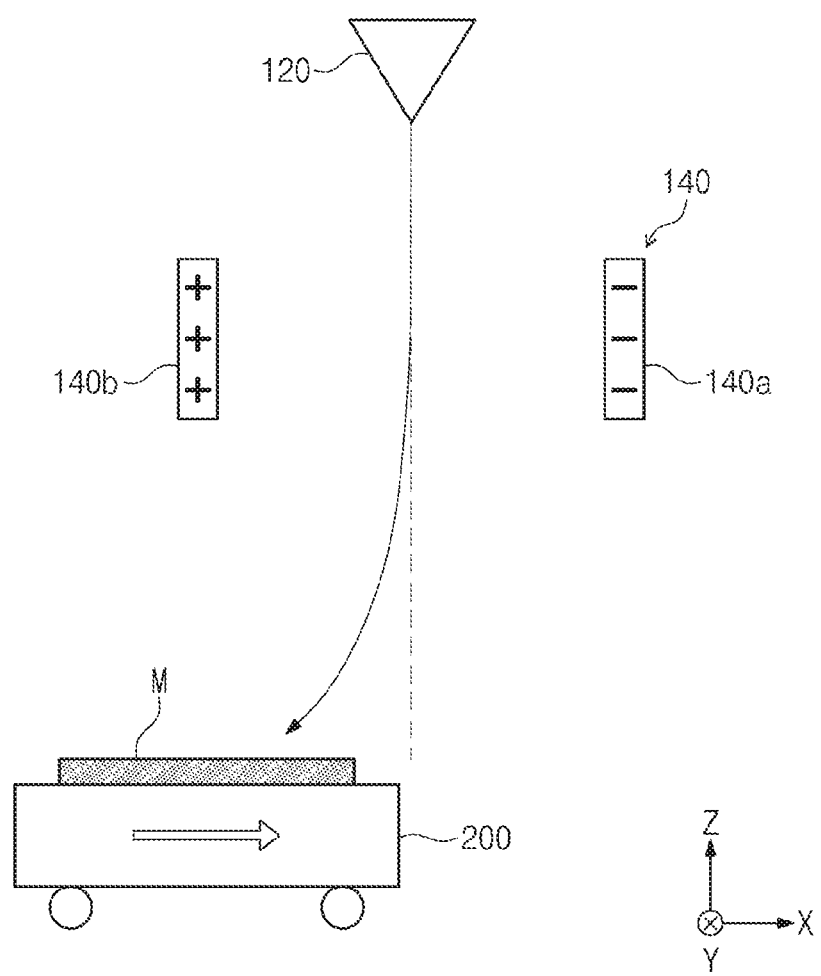
FIG. 4B is a conceptual diagram of a direction drift of an electron beam while a stage is moving along a second direction.
Figure 4C:
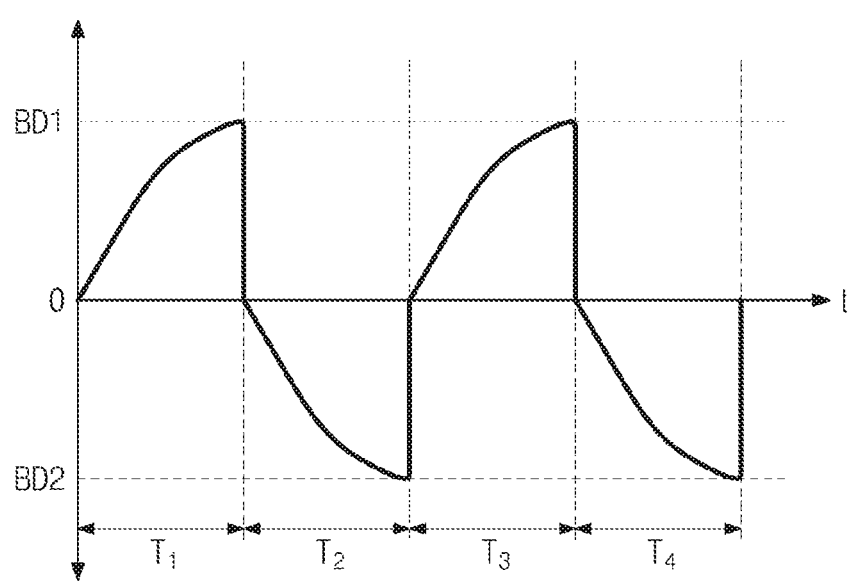
FIG. 4C is a graph of direction drift values of an electron beam in accordance with moving directions of a stage.

FIG. 4A shows a direction drift of the electron beam EB when the stage 200 is moving along the first direction, FIG. 4B shows a direction drift of the electron beam EB when the stage 200 is moving along the second direction, and FIG. 4C shows drift values of the electron beam EB in accordance with the moving directions of the stage 200. In this description, the term drift may refer to a drift phenomenon of the electron beam EB itself, and the term drift value may refer to an amount of drift of the electron beam EB measured under a specific environment.

Referring to FIG. 4A, when the stage 200 moves along the first direction, for example, along the negative X direction, a positive voltage may be applied to the first deflecting plate 140a and a negative voltage may be applied to the second deflecting plate 140b. The electron beam EB emitted from the beam source 120 may be deflected toward the first deflecting plate 140a to which the positive voltage is applied. In this case, the mask M may experience an exposure process along the positive X direction.

Referring to FIG. 4B, when the stage 200 moves along the second direction, for example, along the positive X direction, a negative voltage may be applied to the first deflecting plate 140a and a positive voltage may be applied to the second deflecting plate 140b. The electron beam EB emitted from the beam source 120 may be deflected toward the second deflecting plate 140b to which the positive voltage is applied. In this case, the mask M may experience an exposure process along the negative X direction.

It may be possible to obtain a result shown in FIG. 4C by measuring drift values while reciprocally moving the stage 200 along the first and second directions. FIG. 4C shows direction drift values obtained by moving the stage 200 along the first direction for first and third time durations T1 and T3 and along the second direction for second and fourth time durations T2 and T4. In other words, a first direction drift value BD1 may be obtained when the stage 200 moves along the first direction and a second direction drift value BD2 may be obtained when the stage 200 moves along the second direction.

These results demonstrate that the direction drift values BD1 and BD2 are synchronized as dependent on the moving direction of the stage 200. However, as the exposure process progresses, secondary electrons generated from components (e.g., the stage 200, the mask M, and/or the mark unit 220) in the inner space 110 may accumulate on the deflector 140. For example, the secondary electrons may be electrons additionally produced while the electron beam EB is being transmitted and/or reflected. Secondary electrons accumulating on a positively charged component of the deflector 140 may cause the voltage to vary from the deflection voltage applied to the deflector 140 by the controller 180. In this case, depending on the moving direction of the stage 200, a drift error in which the drift values BD1 and BD2 vary from the intended or desired values may be produced. According to an aspect of the present inventive concept, examples of which will be described in more detail hereinafter, the drift error is compensated for so as not to occur.

Figure 5A:
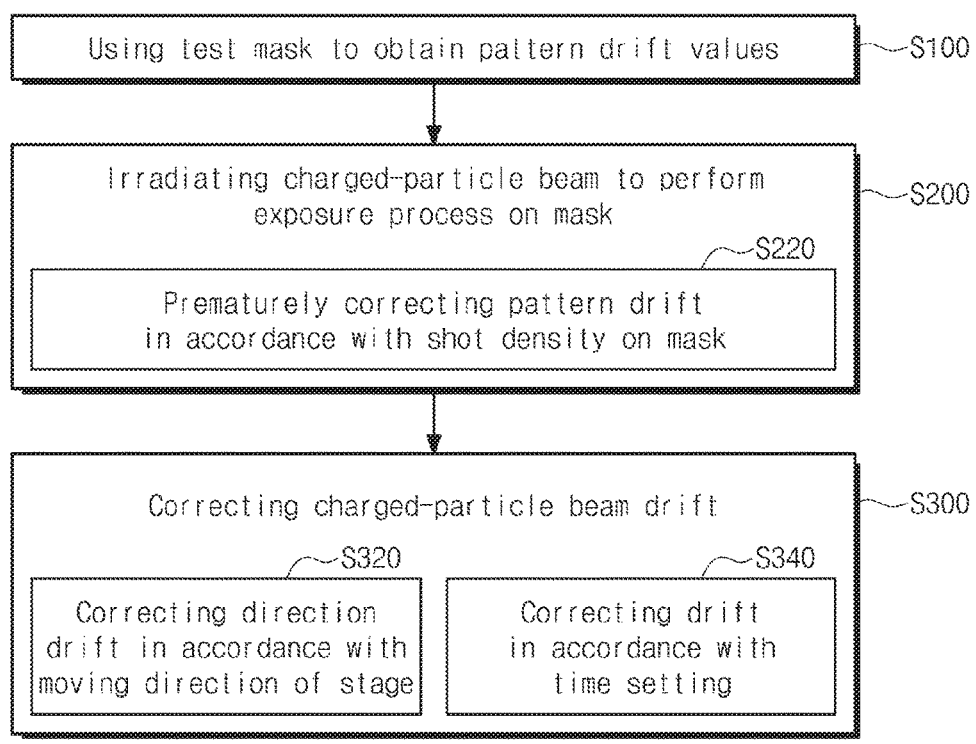
FIG. 5A is a flowchart illustrating an example of an electron beam exposure method according to the present inventive concept.
Figure 5B:
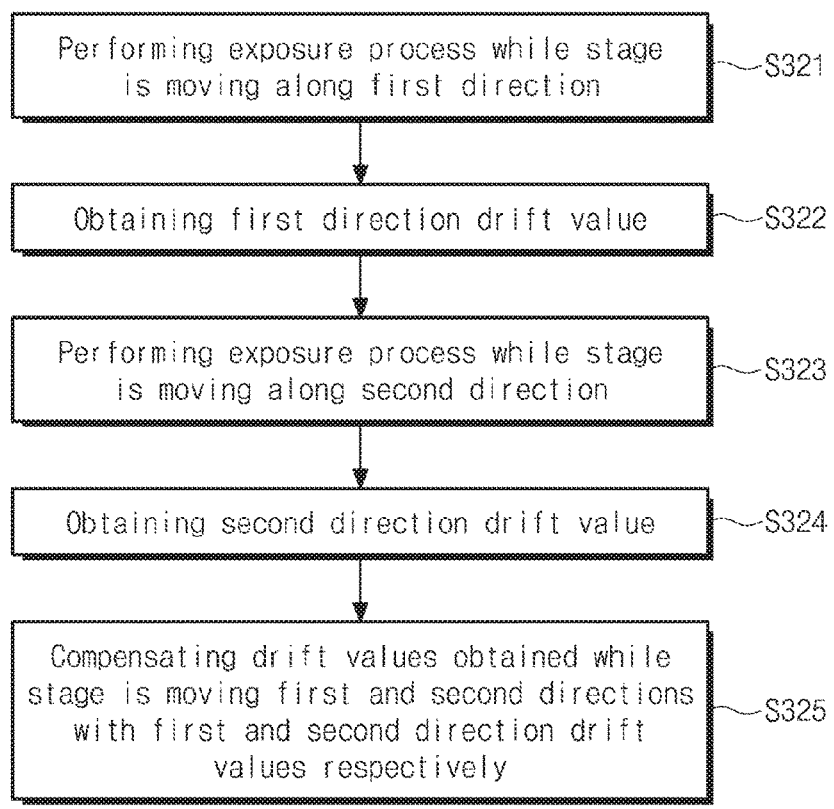
FIG. 5B is a flowchart of an example of a direction drift correction subroutine in the method of FIG. 5A.
Figure 6A:
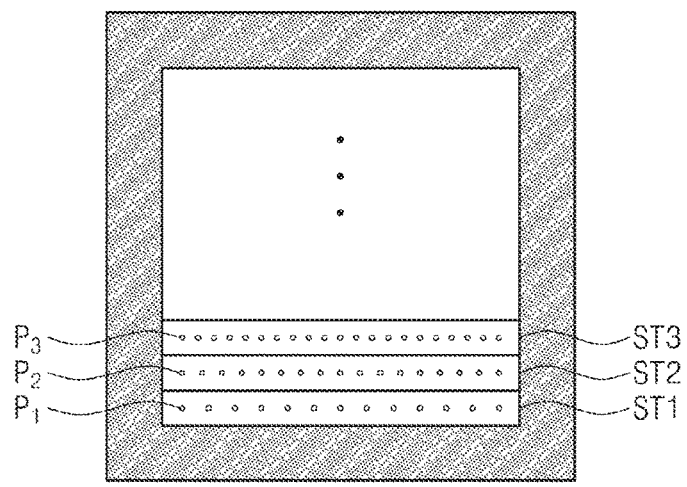
FIG. 6A is a top view of an example of a test mask that has undergone an exposure process.

FIG. 5A is a flowchart showing an example of an electron beam exposure method according to the present inventive concept. FIG. 5B is a flowchart showing an example of a direction drift correction S320 of the method of FIG. 5A. FIG. 6A shows an example of a test mask TM that has undergone an exposure process.

Referring to FIG. 5A, a test mask TM may be used to first obtain pattern drift values (S100). In more detail, the test mask TM may be prepared with design patterns through an exposure process, and the exposure process for transferring the design patterns to the test mask TM may be carried out. The patterns may be preset layout patterns. When the exposure process is terminated, the patterns actually transferred to the test mask TM through the exposure process may be compared with the design patterns and thus it may be possible to obtain pattern drift values in accordance with shot density. For example, the stage 200 may accept the test mask TM that has undergone the exposure process and the test mask TM may be irradiated with the electron beam EB. The light-receiving unit 170 may receive the electron beam EB transmitted and/or reflected from the test mask TM, so that it may be possible to ascertain patterns formed on the test mask TM. The light-receiving unit 170 may produce the pattern drift values by comparing the design patterns with patterns actually formed on the test mask TM. The exposure of the test mask TM and the acquirement of the pattern drift values may be carried out in the chamber 100 of the exposure system 1, or alternatively in a separate apparatus other than the exposure system 1.

The pattern drift values may be obtained in accordance with the shot density. In other words, patterns having shot densities different from each other may have pattern drift values different from each other. In this description, the term of shot may refer to a region exposed by an electron beam for a certain duration and dose to transfer an image thereto, and the term shot density may refer to the number of shots in a unit area. That is, shots may be discrete exposures within the overall process of exposing the test mask TM. Referring to FIG. 6A, the test mask TM that has undergone the exposure process may include a first stripe ST1 having first patterns P1, a second stripe ST2 having second patterns P2, and a third stripe ST3 having third patterns P3. The first to third patterns P1, P2 and P3 may have shot densities different from each other.

After that, the mask M may be placed on the stage 200, and then the electron beam EB may be irradiated onto the mask M so as to perform an exposure process on the mask M (S200). As discussed above, the exposure process may be performed while the stage 200 is moving along the first and second directions parallel to the mask M. In this stage, the pattern drift may be prematurely or initially corrected in accordance with the shot density of the pattern to be formed on the mask M (S220). For example, the controller 180 may correct the deflection voltage applied to the deflector 140 using a pattern drift value corresponding to the shot density of a pattern to be formed on the mask M. In other words, the controller 180 may control the deflection voltage so as to compensate for a corresponding pattern drift value (e.g., the pattern drift value associated with a shot density corresponding to the shot density of the pattern to be formed on the mask M). For example, the controller 180 may supply the deflector 140 with a reverse voltage whose magnitude is as much as the corresponding pattern drift value.

As the exposure process progresses, an electron beam (EB) drift may be corrected (S300). The correction of the EB drift may be a correction of the deflection voltage applied to the electron beam EB. The EB drift correction may include a direction drift correction (S320) in accordance with the moving direction of the stage 200 and/or a drift correction (S340) in accordance with a time setting. The direction drift correction (S320) and the drift correction (S340) may be carried out independently or simultaneously. In addition, the direction drift correction (S320) and/or the drift correction (S340) may be selectively carried out.

Referring to FIGS. 5A and 5B, the direction drift correction (S320) in accordance with the moving direction of the stage 200 may include performing an exposure process while the stage 200 is moving along the first direction (S321), obtaining a first direction drift value while the stage 200 is moving along the first direction during the exposure process (S322), performing an exposure process while the stage 200 is moving along the second direction (S323), and obtaining a second direction drift value while the stage 200 is moving along the second direction during the exposure process (S324). After that, and as the stage 200 continues to move along the first and second directions while the exposure process is performed and the drift values are being obtained, EB drift in the exposure process may be compensated for by modifying the drift in real time with the first and second direction drift values (S325). That is, the first and second direction drift values may be obtained in advance, and one of the first and second direction drift values may be selected for compensation in accordance with the moving direction of the stage 200 at the time of measuring the EB drift. A drift value measured in real time may be operated on by the first direction drift value when the stage 200 is moving along the first direction and by the second direction drift value when the stage 200 is moving along the second direction, thereby producing compensation drift values by which the exposure process is controlled.

The drift correction (S340) in accordance with the time setting is a routine of the timing of the process of EB drift correction. For example, the controller 180 may establish a plurality of set time periods Ts and the EB drift correction is performed within each set time period Ts or at the lapse of every set time period Ts. The set time period Ts may be an arbitrary time period. In the routine, the set time periods Ts may be continuous and/or discontinuous time periods. The drift correction (S340) may be direction drift correction. In an example, the controller 180 may correct the direction drift at the end of or within each set time period Ts. For example, the controller 180 may obtain within the set time period Ts an initial direction drift value at a first point in time of the time period Ts and a final direction drift value at a final point in time or at the lapse of some amount of time within the time period Ts, and may subtract the initial direction drift value from the final direction drift value.

Figure 6B:
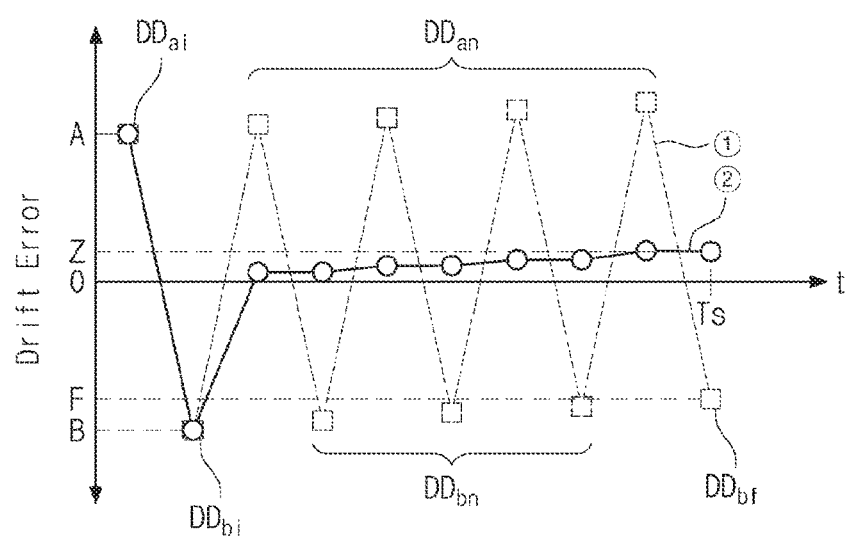
FIG. 6B is a graph of a direction drift correction within a set period.
Figure 6C:
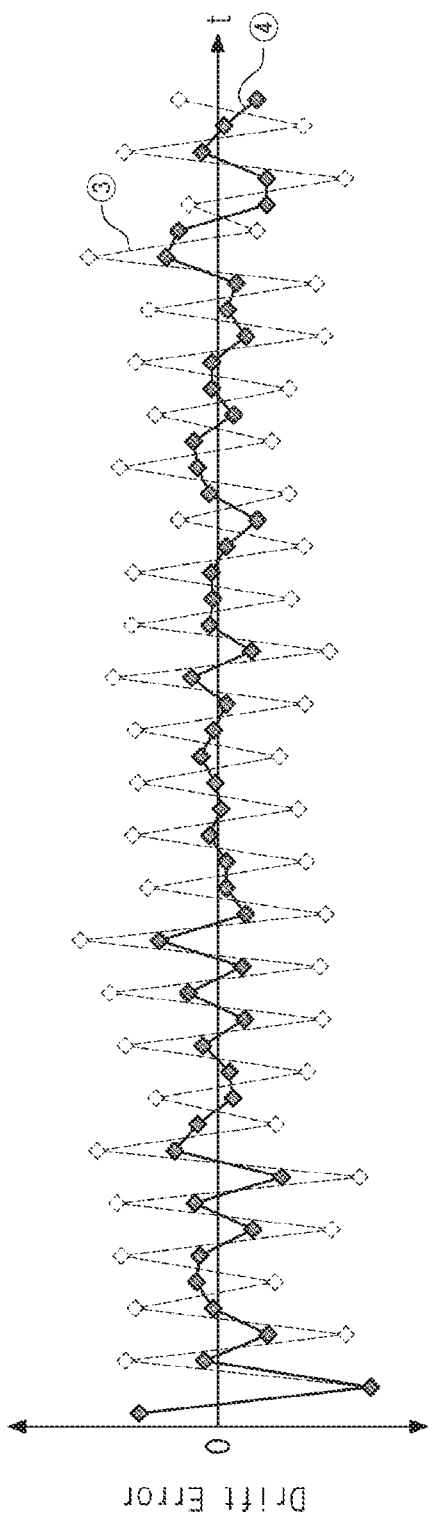
FIG. 6C is a graph of drift-corrected actual drift data.

FIG. 6B shows a direction drift correction within the set period Ts. FIG. 6C shows actual drift data when the direction drift correction is performed as shown in FIG. 6B. Referring to FIG. 6B, the controller 180 may carry out the direction drift correction within the set period Ts. A dotted line (1) in FIG. 6B may represent actually measured values of the drift, i.e., the direction drift as measured in real time. A solid line (2) in FIG. 6B may represent compensation drift values obtained as a result of a revision of the direction drift, and each of the compensation drift values is plotted in the graph of FIG. 6B according to its magnitude (e.g., an absolute value) for clarity and ease of understanding of this aspect of the inventive concept. A dotted line (3) in FIG. 6C may represent actually measured values of the drift, i.e., the direction drift as measured in real time. A solid line (4) in FIG. 6C may represent actually compensation drift values obtained as a result of a revision of the direction drift.

First, initial first and second direction drift values A and B may be obtained within the set period Ts. In FIG. 6B, DDai designates a data of the drift at a point in time during period Ts after an exposure process is initially performed while the stage 200 is moving along the first direction within the set time period Ts, and DDbi designates a data of the drift at a point in time during time period Ts after an exposure process is initially performed while the stage 200 is moving along the second direction within the set time period Ts. DDbf designates a final data of the drift at the end of the exposure process within the set time period Ts, and FIG. 6B shows the final data of the drift DDbf when the stage 200 moves along the second direction. Alternatively, FIG. 6B may show the final data of the drift DDbf when the stage 200 moves along the first direction. DDan and DDbn may designate data of drift occurring while the stage 200 is moving along the first and second directions, respectively, within the set time period Ts. For clarity, FIG. 6B illustrates a process in which drift values are obtained regularly throughout the course of movement of the stage 200 within the set time period Ts. Alternatively, direction drift may be measured and corrections may be made at initial and final times within the set time period Ts.

The initial first and second direction drift values A and B may be obtained, and the second direction drift value B may be subtracted from the final direction drift value F so as to acquire corrected actual drift value Z. In this description, Z may be an absolute value and an actually corrected drift value "F-B" may be a negative value. Additionally, after the initial first and second direction drift values A and B are obtained, it may be possible to revise drift values that are subsequently measured within the set period Ts. FIG. 6B is illustrated as an example of obtaining the initial first and second direction drift values within the set period Ts. Alternatively, the first and second direction drift values may be obtained before the exposure process is performed on the mask M.

Referring to FIG. 6C, drift data may be examined for determining a trend in the direction drift correction, i.e., for determining a model for the drift error, and the drift data examined in this way may be used in controlling subsequent processing. In other words, accurate compensation drift values may be obtained from a model of the direction drift correction.

According to an aspect of the present inventive concept, direction drift caused by the moving direction of the stage 200 may be corrected or compensated for, thereby preventing pattern degradation. Furthermore, pattern drift values related to shot density of desired patterns may be acquired prior to mask forming, and thus be used to prevent in advance drift phenomenon tied to the shot density. In particular, because the deflection voltage is applied based on a model of the pattern drift values correlated to the shot density, it may be possible to exactly form in the stripes fine patterns that are otherwise impossible to monitor. The present inventive concept may therefore provide charged-particle exposure and correction methods having high reliability.

Once patterns are transferred to the resist using an example of the above-described methods, as is conventional per se, the resist may be developed so as to form a resist pattern, and an underlying layer(s) may be etched using the developed resist as a mask. Thus, a patterned article of manufacture, such as a photomask, may be formed.

The effects and benefits of the present inventive concept are not limited to the aforementioned effects and benefits. Other effects and benefits, which are not mentioned above, will be apparent the skilled in the art from the foregoing description and accompanying drawings.

Also, the examples described herein are presented to facilitate an understanding of the present inventive concept and should not be construed as limiting the scope of the present inventive concept. That is, the present inventive concept covers various combinations, modifications, and variations of the examples described herein. Accordingly, the true spirit and scope of the present inventive concept is not defined by the specific examples disclosed herein but by the appended claims.

What is claimed is:

1. A charged-particle beam correction method for use in the manufacturing of electronic devices, comprising:
   moving a stage on which a target sample is disposed;
   an exposure process of irradiating the target sample with the charged-particle beam while the stage is moving; and
   controlling the charged-particle beam to impart a direction drift thereto depending on a direction in which the stage is moving,
   wherein the controlling comprises a correction process including correcting for an error in the direction drift in accordance with the direction in which the stage is moving.

2. The method of claim 1, wherein the moving of the stage comprises moving the stage along a direction parallel to a surface of the target sample irradiated with the charged-particle beam, and
   the correcting for an error in the direction drift comprises:
   obtaining a direction drift value when the stage moves along the direction; and
   revising a value of drift, measured while the stage is moving along the direction, using the direction drift value.

3. The method of claim 1, wherein the moving of the stage comprises moving the stage along a first direction parallel to a surface of the target sample irradiated with the charged-particle beam and a second direction reverse with respect to the first direction, and
   the correcting for an error in the direction drift comprises:
   obtaining a first direction drift value when the stage moves along the first direction;
   obtaining a second direction drift value when the stage moves along the second direction; and
   revising values of drift, measured while the stage is moving along the first and second directions, using the first and second direction drift values, respectively.

4. The method of claim 2, wherein the drift value is acquired before the target sample experiences the exposure process.

5. The method of claim 2, wherein the correcting for an error in the drift of charged-particle beam comprises regulating a deflection voltage that is applied to the charged-particle beam to deflect the charged-particle beam.

6. The method of claim 2, wherein the correcting for an error in the drift of charged-particle beam further comprises establishing a set period of time, and correcting for an error in the drift of charged-particle beam a plurality of times each within a respective discrete period of time equal in duration to the set period of time.

7. The method of claim 6, wherein each correcting for an error in the drift of charged-particle beam within a discrete period of time comprises:
   measuring an initial direction drift at an initial point of the discrete period of time;
   measuring a final direction drift at a final point of the discrete period of time; and
   revising a value of the final direction drift using a value of the initial direction drift.

8. The method of claim 1, wherein the exposure process is carried out in a number of shots across a region of the target sample, whereby the exposure process has a shot density corresponding to a number of shots within a unit area of the region, and
   the correction process includes a pattern drift correction process of controlling the drift of the charged-particle beam in accordance with the shot density of the exposure process.

9. The method of claim 8, wherein correcting the pattern drift correction process comprises:
   providing a test sample and establishing a design pattern;
   a preceding exposure process of exposing the test sample to transfer to the test sample a pattern intended to correspond to the design pattern; and
   subsequently comparing the pattern actually transferred to the test sample by the preceding exposure process with the design pattern to obtain a pattern drift value correlated with the shot density.

10. The method of claim 9, wherein the pattern drift correction process comprises regulating a deflection voltage to deflect the charged-particle beam, during the exposure process of irradiating the target sample, based on a pattern drift value correlated to the shot density using the test sample.

11. A charged-particle beam exposure method for use in the manufacturing of electronic devices, comprising:
   providing a sample that includes patterns having shot densities different from each other;
   using the sample to obtain pattern drift values correlated to the shot densities, respectively; and
   an exposure process of irradiating a target sample with a charged-particle beam to transfer a pattern to the target sample in shots, at a shot density, across a region of the target sample,
   wherein the irradiating of the target sample with the charged-particle beam comprises a correction process of regulating a deflection voltage, which is applied to the charged-particle beam to deflect the charged-particle beam, based on the pattern drift value correlated to the shot density of the pattern to be transferred to the target sample by the exposure process.

12. The method of claim 11, wherein correction process comprises altering a value of the deflection voltage to be applied during the exposure process with a value that offsets the pattern drift value correlated to the shot density.

13. The method of claim 11, wherein using the sample to obtain the pattern drift values comprises:
before the target sample is subjected to the exposure process, providing a test sample and establishing a design pattern;
a preceding exposure process of exposing the test sample to transfer to the test sample a pattern intended to correspond to the design pattern; and
subsequently comparing the pattern actually transferred to the test sample by the preceding exposure process with the design pattern to obtain a pattern drift value correlated with the shot density.

14. The method of claim 11, further comprising:
moving a stage along a direction parallel to a surface of the target sample irradiate by the charged-particle beam in the exposure process, the sample being disposed on the stage; and
controlling the charged-particle beam to impart a direction drift thereto depending on a direction in which the stage is moving,
wherein the controlling the charged-particle beam comprises a correction process including correcting for an error in the direction drift in accordance with the direction in which the stage is moving.

15. The method of claim 14, wherein the moving of the stage comprises moving the stage along a first direction parallel to a surface of the target sample irradiated with the charged-particle beam and a second direction reverse with respect to the first direction, and
the correcting for an error in the direction drift comprises:
obtaining a first direction drift value when the stage moves along the first direction;
obtaining a second direction drift value when the stage moves along the second direction; and
revising values of drift, measured while the stage is moving along the first and second directions, using the first and second direction drift values, respectively.

16. A method of fabricating a patterned article of manufacture, comprising:
supporting a substrate comprising a layer of resist on a stage;
an exposure process including emitting a charged-particle beam from a source along a path between the source and the stage so as to irradiate the resist with the charged-particle beam, and moving the substrate using the stage within the path of the beam to scan the charged-particle beam across the substrate;
a deflection process of deflecting the charged-particle beam at a location along the path during the exposure dependent on a direction in which the substrate is being moved by the stage to impart a drift to the charged-electron beam; and
a correction process of determining at least one compensation drift value that controls the deflection process,
wherein the at least one compensation drift value compensates for any errors in the drift associated with at least one of a direction drift phenomena and a pattern drift phenomena.

17. The method of claim 16, wherein the moving of the substrate comprises moving the stage along a direction parallel to a surface of the layer of resist, and
the correction process comprises:
acquiring a direction drift value correlated with the direction parallel to a surface of the layer of resist,
measuring the drift in real time as the stage is moving along the direction to obtain a value of the drift in real time, and
revising the value of the drift measured in real time using the direction drift value.

18. The method of claim 16, wherein the moving of the substrate comprises moving the stage along a first direction parallel to a surface of the layer of resist and a second direction reverse with respect to the first direction, and
the correction process comprises:
acquiring direction first and second drift values correlated with the first and second directions, respectively,
measuring the drift in real time as the stage is moving in each of the first and second direction to obtain values of the drift in real time, and
revising values of the drift, measured while the stage is moving along the first and second directions, using the first and second direction drift values, respectively.

19. The method of claim 16, wherein the exposure process is carried out in a number of shots across a region of the substrate, whereby the exposure process has a shot density equal to a ratio of the number of shots per unit area of the region, and
the correction process comprises controlling the deflection process using a pattern drift value correlated to the shot density of the desired pattern to be transferred to the resist by the exposure process.

20. The method of claim 19, wherein the correction process comprises:
providing a test sample that includes patterns having shot densities different from each other,
using the sample to obtain pattern drift values correlated to the shot densities, respectively, and
selecting from among the pattern drift values a pattern drift value correlated to the shot density of the desired pattern to be transferred to the layer of resist by the exposure process.

* * * * *